United States Patent [19]
van Deursen

[11] 4,152,698
[45] May 1, 1979

[54] DIGITAL-TO-ANALOG CONVERTER WITH SCANNING SYSTEM

[75] Inventor: Willem P. van Deursen, Eindhoven, Netherlands

[73] Assignee: U.S. Philips Corporation, New York, N.Y.

[21] Appl. No.: 763,009

[22] Filed: Jan. 27, 1977

[30] Foreign Application Priority Data

Feb. 11, 1976 [NL] Netherlands .................... 7601365

[51] Int. Cl.² .......................................... H03K 13/02
[52] U.S. Cl. ...................... 340/347 DA; 235/92 SH; 325/464; 340/347 M
[58] Field of Search ................ 340/347 M, 347 DA; 325/464; 235/165, 92 DM, 92 SH, 92 NG; 307/221 R

[56] References Cited

U.S. PATENT DOCUMENTS

| | | | |
|---|---|---|---|
| 2,907,021 | 9/1959 | Woods | 340/347 DA |
| 3,521,036 | 7/1970 | Bartlett et al. | 235/92 SH |
| 3,942,171 | 3/1976 | Haraszti et al. | 340/347 DA |
| 4,009,374 | 2/1977 | Taylor | 235/92 SH |

*Primary Examiner*—Thomas J. Sloyan
*Attorney, Agent, or Firm*—Thomas A. Briody; James J. Cannon, Jr.

[57] ABSTRACT

A digital-to-analog converter in which a comparison of a digital signal combination to be converted with a signal combination produced by a counting circuit is implemented serially for minimizing the number of connections in the circuit.

3 Claims, 2 Drawing Figures

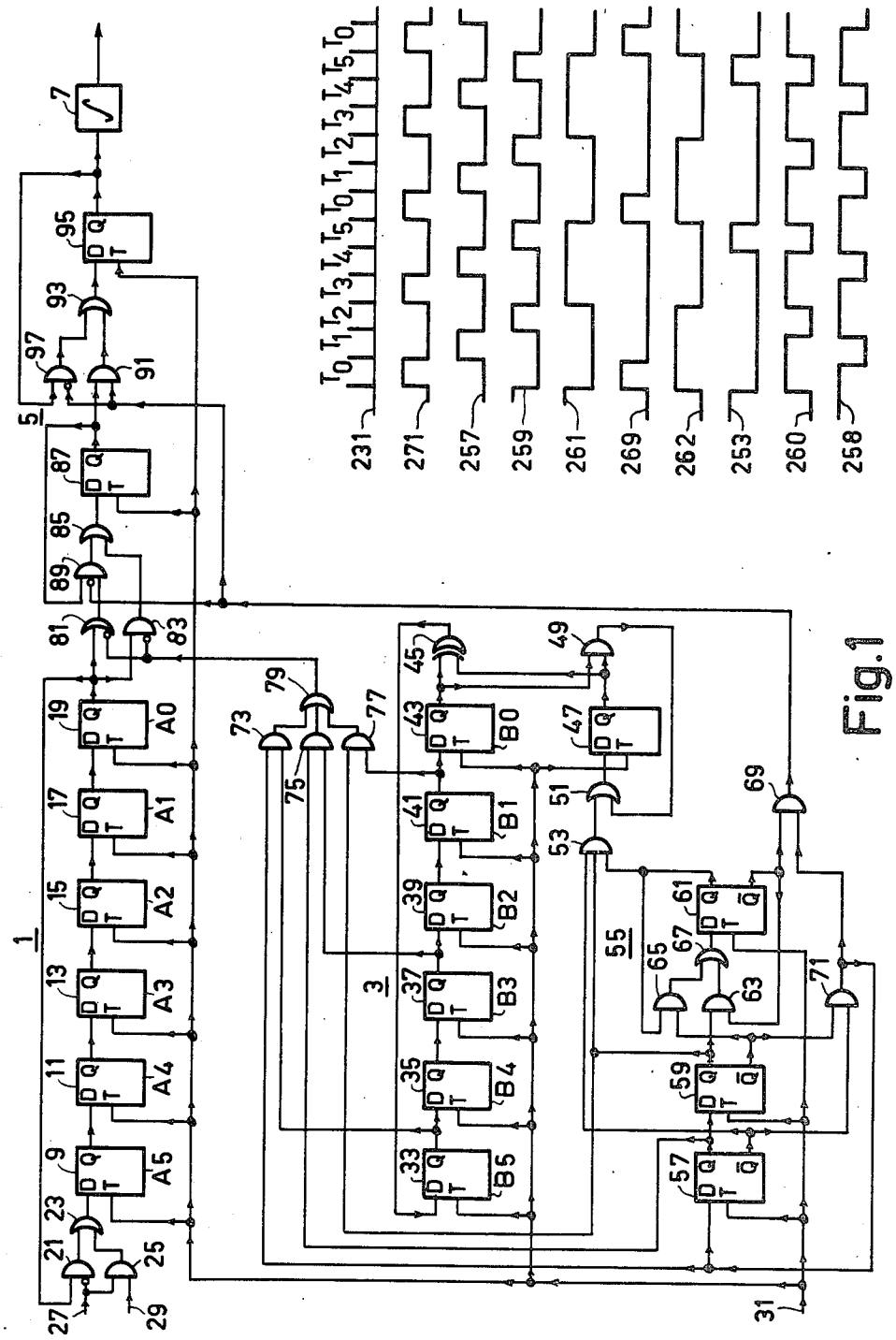

DIGITAL-TO-ANALOG CONVERTER WITH SCANNING SYSTEM

The invention relates to a digital-to-analog converter in which an input signal combination corresponding to a digital number is compared in a comparison circuit with a signal combination corresponding to a periodically occurring series of numbers. The signal combination is produced by a counter circuit which is continuously controlled by a clock pulse. A pulse-shaped output signal having an average value which corresponds to the value of the digital number to be converted is generated by the comparison circuit.

U.S. Pat. No. 3,836,908 discloses a digital-to-analog converter of the above-mentioned type. Such a converter has the advantage that no expensive precision resistor network need to be used so that the converter can be constructed almost fully as an integrated circuit.

It is an object of the invention to make such a converter still more suitable for construction in integrated circuitry.

A digital-to-analog converter according to the invention and of the kind mentioned in the preamble is therefore characterized in that the comparison circuit is a sequential comparison circuit wherein successively signals corresponding to each of the figures of the digital number are compared with those corresponding to the figures of the series of numbers generated by the counter circuit.

Since this measure the circuit can operate with a considerably reduced number of components whereas the number of connections between the components is much smaller than for the prior art converter circuits which work in parallel. Since this type of converter circuit which operates with an intermediate conversion from digital to number of pulses of the conversion period or pulse width for each conversion period, is substantially only used in circuits in which the conversion rate need not satisfy high requirements such as, for example, circuits for generating tuning or function control voltages in, for example, television receivers the somewhat lower conversion rate of a serial circuit is of minor importance in those circuits.

Hereinafter the same expressions will in general be used for digital numbers and figures and corresponding signal combinations and signals.

If the digital number to be converted has an even number of figures and the figure of the largest value is compared with the figure with the lowest value of the comparison number and so on then the circuit can be constructed in a particularly simple manner because the comparison number can be scanned in jumps, each time skipping the intermediate figure.

An embodiment of the invention will now be further explained with reference to the drawing in which FIG. 1 is a block diagram of a digital-to-analog converter according to the invention, FIG. 2 shows a number of wave forms such as they occur in the circuit of FIG. 1.

In FIG. 1 a shift register 1 contains the digital number to be converted. A counting circuit 3 supplies a digital series of comparison figures, the value of which is compared with the number to be converted by comparing its figures with the figures of the digital number to be converted in the register 1. This is done in a comparison circuit 5. The comparison circuit 5 supplies a pulse signal the average value of which is proportional to the value of the digital number to be converted. This pulse signal is converted in an integrated circuit 7 which may be a charging and discharging circuit which is operated by the pulse signal, into a d.c. voltage which corresponds to the value of the digital number to be converted.

The shift register 1 is a circulating shift register. It comprises a plurality of sections 9, 11, 13, 15, 17, 19 which may each consist of a D-type flip-flop. A D-type flip-flop must be understood to mean a JK flip-flop whose K-input is connected via an inverter to the J-input and whose J-input is called the D-input of the D-flip-flop. At the instant of occurrence of a clock pulse which is fed to an T-input of a section the information which is available at a D-input thereof is entered and then becomes available at a Q-output. The Q-output of the last section 19 is connected via a gate circuit having an AND-gate 21 an OR-gate 23 and an AND-gate 25 to the D-input of the first section. Before conversion can take place the shift register 1 is filled with the digital number to be converted by means of this gate circuit 21, 23, 25. An input 27 which is connected to the AND-gate 25 is then adjusted to its high state so that the AND-gate 25 becomes conductive owing to which the AND-gate 21 is blocked via an inverting input and prevents the information which is at the output of the shift register 1 from being supplied to its input. The AND-gate 25 now passes signals which are applied to an input 29 and which correspond to figures of the digital number, on to the D-input of the first section 9 via the OR-gate 23. The shift register 1 is now filled in such a way that the figure having the lowest value (least significant bit) is placed in the last section 19 and the figure having the highest value (most significant bit) in the first section 9. After filling of the shift register 1 the input 27 becomes low so that the AND-gate 25 is made non-conductive and the AND-gate 21 passes signals from the output of the last section 19 to the D-input of the first section via the OR-gate 23. Both placing the information in the shift register and circulating the information takes place under the action of a clock pulse fed to an input 31. This clock pulse is indicated by reference 231 in FIG. 2.

The counting circuit 3 comprises a circulating shift register having a plurality of successive sections 33, 35, 37 39, 41, 43 which are each constituted by a flip-flop of the D-type. The Q-output of the last section 43 is connected to the D-input of the first section 33 via an exlusive OR-gate 45. This gate 45 also receives an output signal of a Q-output of a D-flip-flop 47. The Q-output signal of the last section and the Q-output signal of the D-flip-flop 47 are furthermore fed to an AND-gate 49 the output of which is connected to an input of an OR-gate 51. Another input of the OR-gate 51 is supplied with a pulse which is indicated in FIG. 2 by 253 and which causes the number present in the shift register 3 to be increased by a value of one and to be entered anew. This happens in conjunction with the D-flip-flop 47 and the gates 45 and 49. The Q-output of the D-flip-flop 47 remains high until the output of the last section 43 of the shift register of the counting circuit 3 becomes low which renders the AND-gate 49 nonconductive. As a result hereof the Q-output of the D-flip-flop 47 becomes low again at the next clock pulse. The gate 51, the D-flip-flop 47 and the gate 49 fulfil the "save-1" or carry function when adding the number one to the number in the shift register 33-43. Adding is performed by the exclusive OR-gate 45.

The signal 253 which adjusts the OR-gate 51 to its high state before the beginning of the adding action is obtained from and AND-gate 53 which is part of a pulse generator 55.

The pulse generator 55 comprises three D-flip-flops 57, 59, 61 to whose T-input the clock pulse is supplied. The Q-output of the flip-flop 57 is connected to the D-input of the flip-flop 59 and the Q-output thereof to an AND-gate 63 the other input of which is connected to $\bar{Q}$-output of the flip-flop 61. The $\bar{Q}$-output of the flip-flop 59 is connected to an input of an AND-gate 65 the other input of which is connected to the Q-output of the flip-flop 61. The outputs of the gates 63 and 65 are connected to the D-input of the flip-flop 61 via an OR-gate 67. The $\bar{Q}$-output of this flip-flop 61 is connected to an input of an AND-gate 69 the other input of which is connected to the output of an AND-gate 71 whose inputs are connected to the $\bar{Q}$-output of the flip-flop 59 and the $\bar{Q}$-output of the flip-flop 57 respectively. The output of the gate 71 is connected to the D-input of the flip-flop 57. The signal having the waveform 271 of FIG. 2 is produced at this output of the gate 71, at the output of the gate 69 the waveform 269, at the Q-output of the flip-flop 57 the waveform 257, at the Q-output of the flip-flop 59 the waveform 259, at the Q-output of the flip-flop 61 one waveform 261, at the $\bar{Q}$-output of the flip-flop 61 the waveform 262, at the $\bar{Q}$-output of the flip-flop 59 the waveform 260 and at the $\bar{Q}$-output of the flip-flop 57 the waveform 258.

The signals 271, 257 and 259 are fed to three AND-gates 73, 75 and 77 respectively the other inputs of which are connected to the Q-outputs of the flip-flops 33, 37 and 41 respectively of the counting circuit 3. Consequently there is supplied by an OR-gate 79 which is connected to the output of the AND-gate 73, 75, 77 an input signal to the comparison circuit 5 in the following sequence: during a period of time $T_o$ the Q-output voltage of the first section 33, during a period of time $T_1$ that of the third section 37, during a period of time $T_2$ that of the fifth section 41, during a period of time $T_3$ that of the first section 33, during a period of time $T_4$ that of the third section 37 and during a period of time $T_5$ that of the fifth section 41.

The contents of the sections of the counting circuit 3 and of the shift register 1 are indicated in the Table herebelow as a function of the relevant period of time as indicated in FIG. 2 at the waveform 231, where A is the digital number to be converted having the binary digits A5, A4, A3, A2, A1, A0 and B the number produced by the counter 3 with the binary digits B5, B4, B3, B2, B1, B0.

The input of the comparison circuit 5 is constituted by an OR-gate 81 and an AND-gate 83. The OR-gate 81 supplies an output voltage which is high when $A_n + \bar{B}_m = 1$ that is to say $A_n \geq B_m$ and the AND-gate 83 when $A_n\bar{B}_m = 1$ that is to say $A_n > B_m$. During the first comparison period $T_0$ $A_0$ is compared with $B_5$. If $A_0 > B_5$ the high output voltage of the AND-gate 83 is passed on via an OR-gate 85 to the D-input of a D-flip-flop 87 which retains this value during the period $T_1$. If now $A_1 < B_4$ then the output voltage of the OR-gate 81 becomes low. This output voltage is fed to an input of an AND-gate 89 the other inputs of which are connected to the Q-output of the flip-flop 87 and via an inverter to the output of the gate 69 so that the waveform 269 ensures that the gate 89 is at all times non-conductive during $T_0$. The output voltage of the AND-gate 83 is also low if $A_1 < B_4$ and the D-flip-flop 87 assumes the value 0. If on the contrary $A_1$ would be equal to or larger than $B_4$ then the output voltage of the gate 89 would be high and a high value would again be entered into the flip-flop 87. At the end of a comparison cycle the Q-output of the flip-flop 87 during the period of time $T_0$ is high if A would be larger than or equal to the comparison number supplied by the counter 3 and would be low if A would be smaller than that comparison number. During $T_0$ the gate 89 is non-conductive. During $T_0$ the Q-output signal of the flip-flop 87 is stored via an AND-gate 91 and an OR-gate 93 in a D-flip-flop 95 which retains this value via an AND-gate 97 which is coupled to its Q-output and to another input of which the inverted signal 269 is supplied, until the next period $T_0$.

Since the comparison number supplied by the counter is obtained by reversing the significance of the figures of the B-number a quantity of pulses is fed to the integrator 7 in each period which quantity depends on the value of the figure A. Should the sequence of significance of the figures of the B-number not be inverted then the scanning circuit constituted by the gated 73, 75, 77, 79 could have been dispensed with and the output signal of the flip-flop 43 might serve as comparison signal. Then a pulse-width modulation of the signal to be fed to the integrator 7 would occur depending on the value of the A-number.

A combination of pulse-number and pulse-width modulation can be obtained by a partly inverted and partly non-inverted sequence of the B-figures. This can be achieved by modifying a scanning circuit at the outputs of the counting circuit 3. For example, the number $A_5\, A_4\, A_3\, A_2\, A_1\, A_0$ can be compared with $B_3\, B_2\, B_1\, B_0\, B_4\, B_5$ if in the period $T_0$ the output of the flip-flop 33, in

| Counting circuit 3 | | | | | | | | | Shift register 1 | | | | |
|---|---|---|---|---|---|---|---|---|---|---|---|---|---|
| Section | 33 | 35 | 37 | 39 | 41 | 43 | 9 | 11 | 13 | 15 | 17 | 19 |
| $T_0$ | $B_5$ | $B_4$ | $B_3$ | $B_2$ | $B_1$ | $B_0$ | $A_5$ | $A_4$ | $A_3$ | $A_2$ | $A_1$ | $A_0$ |
| $T_1$ | $B_0'$ | $B_5$ | $B_4$ | $B_3$ | $B_2$ | $B_1$ | $A_0$ | $A_5$ | $A_4$ | $A_3$ | $A_2$ | $A_1$ |
| $T_2$ | $B_1'$ | $B_0$ | $B_5$ | $B_4$ | $B_3$ | $B_2$ | $A_1$ | $A_0$ | $A_5$ | $A_4$ | $A_3$ | $A_2$ |
| $T_3$ | $B_2'$ | $B_1'$ | $B_0'$ | $B_5$ | $B_4$ | $B_3$ | $A_2$ | $A_1$ | $A_0$ | $A_5$ | $A_4$ | $A_3$ |
| $T_4$ | $B_3'$ | $B_2'$ | $B_1'$ | $B_0'$ | $B_5$ | $B_4$ | $A_3$ | $A_2$ | $A_1$ | $A_0$ | $A_5$ | $A_4$ |
| $T_5$ | $B_4'$ | $B_3'$ | $B_2'$ | $B_1'$ | $B_0'$ | $B_5$ | $A_4$ | $A_3$ | $A_2$ | $A_1$ | $A_0$ | $A_5$ |
| $T_0$ | $B_5'$ | $B_4'$ | $B_3'$ | $B_2'$ | $B_1'$ | $B_0'$ | $A_5$ | $A_4$ | $A_3$ | $A_2$ | $A_1$ | $A_0$ |
| $T_1$ | $B_0''$ | $B_5'$ | $B_4'$ | $B_3'$ | $B_2'$ | $B_1'$ | $A_0$ | $A_5$ | $A_4$ | $A_3$ | $A_2$ | $A_1$ |
| $T_2$ | $B_1''$ | $B_0''$ | $B_5'$ | $B_4'$ | $B_3'$ | $B_2'$ | $A_1$ | $A_0$ | $A_5$ | $A_4$ | $A_3$ | $A_2$ |
| $T_3$ | $B_2''$ | $B_1''$ | $B_0''$ | $B_5'$ | $B_4'$ | $B_3'$ | $A_2$ | $A_1$ | $A_0$ | $A_5$ | $A_4$ | $A_3$ |

In the relevant comparison periods the underlined figures are compared with one another in the comparison circuit 5. It furthermore holds for the Table that $B' = B+1$ and $B'' = B'+1$.

$T_1$ that of the flip-flop 37 and in the periods $T_2$ to $T_5$ inclusive the output of the flip-flop 35 is scanned.

As in the sequential comparison described a portion of a number $B' = B+1$ and a portion of a number B is taken in one comparison period, the pulse pattern at the output of the flip-flop 95 slightly differs from that in the case of a parallel comparison. However, the output voltages obtained are in both cases fully identical. In order to correct for small differences in pulse patterns, a shift register might be connected to the output of the flip-flop 43 and the outputs of the counting circuit 3 and of that shift register might be scanned by the scanning circuit. In that case the circuit becomes less simple.

The pulse generator 55 may further be used to produce the signal at the input 27 of the shift register 1 so that writing into this register is synchronous with the conversion.

It will be obvious that by inverting the input signals of the gates 81 and 83 the comparison circuit 5 can supply a signal which is high if the comparison number exceeds the A-number.

If the number of figures of a digital figure to be converted is odd the number of sections of the shift register of the counting circuit 3 becomes odd and the scanning circuit may become slightly more complicated if the total inversion of the sequence of the B-number is required.

If the A-number can be entered into the register 1 with an inverted sequence of the figures the scanning circuit can be dispensed with for the case described.

To obtain a combined pulse number pulse width modulation it is also possible to increase the contents of the counting circuit 3 after each circulation by a same, for example odd, number. Then the sequence of the figures need not be inverted and the scanning circuit can be dispensed with.

What is claimed is:

1. A digital-to-analog converter comprising a clock source;
   a counting circuit controlled by said clock source, comprising a circulating shift register having a plurality of shift elements, each shift element having an output for producing a sequence of comparison signals;
   an input signal source for providing a digital input signal to be converted;
   comparison means connected to said input signal source for comparing the digital input signal to a comparison signal which corresponds to a periodically occurring sequence of numbers, and generating a pulse-shaped output signal having an average value which corresponds to the value of the digital input signal, comprising a sequential comparison circuit in which serial signals corresponding to each of the digits of the digital input signal are successively compared with the corresponding digits of the sequence of comparison signals generated by said counting circuit;
   an adder circuit connected between the output of said counting circuit and the input of said counting circuit to increase its count by one after each circulating action; and
   a scanning circuit connecting ones of said plurality of outputs of said circulating shift register to an input of the comparison circuit, in a predetermined pattern according to the nature of the digital-to-analog conversion.

2. A digital-to-analog converter as claimed in claim 1, wherein said circulating shift register comprises n sections, n being an even integer, the outputs of the 1st, 3rd and $k^{th}$ sections where k is odd, $k<n$, being cyclically scanned by said scanning circuit.

3. A digital-to-analog converter as claimed in claim 1, wherein an X-signal is applied to one input of the sequential comparison circuit and an Y-signal to another input, said sequential comparison circuit comprising
   a first gate circuit whose output signal is $X\overline{Y}$,
   a second gate circuit whose output signal is $X+\overline{Y}$,
   a third gate circuit to which the signal $X\overline{Y}$ is applied the output of which is connected to a D-input of
   a D-flip-flop operated by the clock pulse and whose Q-output is connected to the input of
   a fourth gate circuit of the AND-type to another input of which the output of
   the second gate circuit is connected for rendering this fourth gate circuit non-conductive at the begining of a comparison cycle while furthermore
   a storage circuit is connected to the Q-output of said D-flip-flop for storing, during a counting cycle, the signal obtained by said comparison circuit.

* * * * *